(12) United States Patent
Hineman et al.

(10) Patent No.: US 7,211,849 B2
(45) Date of Patent: May 1, 2007

(54) PROTECTIVE LAYERS FOR MRAM DEVICES

(75) Inventors: Max Hineman, Boise, ID (US); Karen Signorini, Boise, ID (US); Brad J. Howard, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/856,356

(22) Filed: May 28, 2004

(65) Prior Publication Data

US 2004/0264240 A1   Dec. 30, 2004

Related U.S. Application Data

(62) Division of application No. 10/135,921, filed on Apr. 30, 2002, now Pat. No. 6,783,995.

(51) Int. Cl.
*H01L 29/76* (2006.01)
(52) U.S. Cl. ............... 257/295; 257/421; 257/E21.665
(58) Field of Classification Search ........ 257/295–310, 257/421
See application file for complete search history.

(56) References Cited

U.S. PATENT DOCUMENTS

| | | | |
|---|---|---|---|
| 3,623,032 A | 11/1971 | Schapira | |
| 3,623,035 A | 11/1971 | Kobayashi et al. | |
| 3,816,909 A | 6/1974 | Maeda et al. | |
| 3,947,831 A | 3/1976 | Kobayashi et al. | |
| 4,044,330 A | 8/1977 | Johnson et al. | |
| 4,060,794 A | 11/1977 | Feldman et al. | |

(Continued)

FOREIGN PATENT DOCUMENTS

DE   198 36 567 A1   2/2000

(Continued)

OTHER PUBLICATIONS

Pohm et al., "Experimental and Analytical Properties of 0.2 Micron Wide, Multi-Layer, GMR, Memory Elements", *IEEE Transactions of Magnetics*, vol. 32., No. 5, Sep. 1996, pp. 4645-4647.

(Continued)

*Primary Examiner*—H. Jey Tsai
(74) *Attorney, Agent, or Firm*—Knobbe Martens Olson & Bear LLP

(57) ABSTRACT

A method of forming a magnetic random access memory (MRAM) using a sacrificial cap layer on top of the memory cells and the structure resulting therefrom are described. A plurality of individual magnetic memory devices with cap layers are fabricated on a substrate. A continuous first insulator layer is deposited over the substrate and the magnetic memory devices. Portions of the first insulator layer are removed at least over the magnetic memory devices and then the cap layers are selectively removed from the magnetic memory devices, thus exposing active top surfaces of the magnetic memory devices. The top surfaces of the magnetic memory devices are recessed below the top surface of the first insulator layer. Top conductors are formed in contact with the active top surfaces of the magnetic memory devices. In an illustrated embodiment, spacers are also formed along the sides of the magnetic memory devices before the first insulator layer is deposited.

23 Claims, 9 Drawing Sheets

U.S. PATENT DOCUMENTS

| | | |
|---|---|---|
| 4,158,891 A | 6/1979 | Fisher |
| 4,455,626 A | 6/1984 | Lutes |
| 4,731,757 A | 3/1988 | Daughton et al. |
| 4,780,848 A | 10/1988 | Daughton et al. |
| 4,801,883 A | 1/1989 | Muller et al. |
| 4,849,695 A | 7/1989 | Muller et al. |
| 4,945,397 A | 7/1990 | Schuetz |
| 5,039,655 A | 8/1991 | Pisharody |
| 5,064,499 A | 11/1991 | Fryer |
| 5,140,549 A | 8/1992 | Fryer |
| 5,496,759 A | 3/1996 | Yue et al. |
| 5,547,599 A | 8/1996 | Wolfrey et al. |
| 5,569,617 A | 10/1996 | Yeh et al. |
| 5,587,943 A | 12/1996 | Torok et al. |
| 5,650,958 A | 7/1997 | Gallagher et al. |
| 5,691,228 A | 11/1997 | Ping et al. |
| 5,701,222 A | 12/1997 | Gill et al. |
| 5,721,171 A | 2/1998 | Ping et al. |
| 5,726,498 A | 3/1998 | Licata et al. |
| 5,741,435 A | 4/1998 | Beetz, Jr. et al. |
| 5,744,398 A | 4/1998 | Byun et al. |
| 5,756,366 A | 5/1998 | Berg et al. |
| 5,756,394 A | 5/1998 | Manning et al. |
| 5,792,687 A | 8/1998 | Jeng et al. |
| 5,795,823 A | 8/1998 | Avanzino et al. |
| 5,851,875 A | 12/1998 | Ping et al. |
| 5,861,328 A | 1/1999 | Tehrani et al. |
| 5,869,389 A | 2/1999 | Ping et al. |
| 5,882,979 A | 3/1999 | Ping et al. |
| 5,899,742 A | 5/1999 | Sun |
| 5,926,394 A | 7/1999 | Nguyen et al. |
| 5,939,758 A | 8/1999 | Arima |
| 5,945,350 A | 8/1999 | Violette et al. |
| 5,956,267 A | 9/1999 | Hurst et al. |
| 5,982,658 A | 11/1999 | Berg et al. |
| 5,994,193 A | 11/1999 | Gardner et al. |
| 6,028,786 A | 2/2000 | Nishimura |
| 6,048,739 A | 4/2000 | Hurst et al. |
| 6,100,185 A | 8/2000 | Hu |
| 6,110,812 A | 8/2000 | Ho |
| 6,130,145 A | 10/2000 | Ilg et al. |
| 6,136,705 A | 10/2000 | Blair |
| 6,153,443 A | 11/2000 | Durlam et al. |
| 6,156,630 A | 12/2000 | Iyer |
| 6,165,803 A | 12/2000 | Chen et al. |
| 6,174,737 B1 | 1/2001 | Durlam et al. |
| 6,174,764 B1 | 1/2001 | Manning |
| 6,211,054 B1 | 4/2001 | Li et al. |
| 6,211,090 B1 | 4/2001 | Durlam et al. |
| 6,218,302 B1 * | 4/2001 | Braeckelmann et al. .... 438/687 |
| 6,255,701 B1 | 7/2001 | Shimada |
| 6,338,899 B1 | 1/2002 | Fukuzawa et al. |
| 6,358,756 B1 | 3/2002 | Sandhu et al. |
| 6,379,978 B2 | 4/2002 | Goebel et al. |
| 6,391,658 B1 | 5/2002 | Gates et al. |
| 6,392,922 B1 | 5/2002 | Liu et al. |
| 6,440,753 B1 * | 8/2002 | Ning et al. .................... 438/3 |
| 6,485,989 B1 | 11/2002 | Signorini |
| 6,500,710 B2 | 12/2002 | Nakagawa |
| 6,518,071 B1 * | 2/2003 | Durlam et al. ................. 438/3 |
| 6,555,858 B1 * | 4/2003 | Jones et al. ................. 257/295 |
| 6,627,913 B2 * | 9/2003 | Chen .......................... 257/10 |
| 6,630,718 B1 | 10/2003 | Trivedi |
| 6,754,053 B2 * | 6/2004 | Yoshikawa et al. ...... 360/324.1 |
| 2002/0041514 A1 | 4/2002 | Scheler et al. |
| 2002/0048946 A1 | 4/2002 | Tang et al. |

FOREIGN PATENT DOCUMENTS

| | | |
|---|---|---|
| EP | 0 776 011 A2 | 5/1997 |
| JP | 2000-30222 | 1/2000 |
| WO | WO 98/20496 | 5/1998 |
| WO | WO 00/19440 | 4/2000 |

OTHER PUBLICATIONS

Pohm et al., "The Architecture of a High Performance Mass Store with GMR Memory Cells", *Nonvolatile Electronics*, Honeywell Brochure, pp. 1-3.

Prinz, Gary A., "Magnetoelectronics," *Science*, vol. 282, Nov. 27, 1998., pp. 1660-1663.

Razavi et al., "Design Techniques for High-Speed, High Resolution Comparators," *IEEE Journal of Solid-State Circuits*, vol. 27, No. 12, Dec. 1992, pp. 1916-1926.

Wang et al., "Feasibility of Ultra-Dense Spin-Tunneling Random Access Memory," *IEEE Transactions on Magnetics*, vol. 33, No. 6, Nov. 1997, pp. 4498-4512.

PCT Search Report for PCT/US 03/12675.

* cited by examiner

PROTECTIVE LAYERS FOR MRAM DEVICES

RELATED APPLICATION

This application is a divisional application of U.S. application Ser. No. 10/135,921, entitled "PROTECTIVE LAYERS FOR MRAM DEVICES," filed Apr. 30, 2002 now U.S. Pat. No. 6,783,995, the entirety of which is incorporated by reference herein.

BACKGROUND OF THE INVENTION

1. Field of the Invention

This invention is directed generally to magnetic memory devices for storing digital information and, more particularly, to methods and structures for forming electrical contacts to the devices.

2. Description of the Related Art

The digital memory most commonly used in computers and computer system components is the dynamic random access memory (DRAM), wherein voltage stored in capacitors represents digital bits of information. Electric power must be supplied to these memories to maintain the information because, without frequent refresh cycles, the stored charge in the capacitors dissipates, and the information is lost. Memories that require constant power are known as volatile memories.

Non-volatile memories do not need refresh cycles to preserve their stored information, so they consume less power than volatile memories and can operate in an environment where the power is not always on. There are many applications where non-volatile memories are preferred or required, such as in cell phones or in control systems of automobiles.

Magnetic random access memories (MRAMs) are non-volatile memories. Digital bits of information are stored as alternative directions of magnetization in a magnetic storage element or cell. The storage elements may be simple, thin ferromagnetic films or more complex layered magnetic thin-film structures, such as tunneling magnetoresistance (TMR) or giant magnetoresistance (GMR) elements.

Memory array structures are formed generally of a first set of parallel conductive lines covered by an insulating layer, over which lies a second set of parallel conductive lines, perpendicular to the first lines. Either of these sets of conductive lines can be the bit lines and the other the word lines. In the simplest configuration, the magnetic storage cells are sandwiched between the bit lines and the word lines at their intersections. More complicated structures with transistor or diode latching can also be used. When current flows through a bit line or a word line, it generates a magnetic field around the line. The arrays are designed so that each conductive line supplies only part of the field needed to reverse the magnetization of the storage cells. In one arrangement, switching occurs only at those intersections where both word and bit lines are carrying current. Neither line by itself can switch a bit; only those cells addressed by both bit and word lines can be switched.

The magnetic memory array of FIG. 1 illustrates, in a basic way, the three functional layers of a TMR device. TMR devices 10 work by electron tunneling from one magnetic layer to another through a thin barrier layer 12. The tunneling probability is greatest when the magnetic layers 14, 16, on either side of the barrier layer 12, have parallel magnetizations and least when the magnetizations are anti-parallel. In order for the devices to function properly, these layers must be electrically isolated from one another. Any short circuiting of the layers bypasses the data storage of the device.

Copper conductors for MRAM arrays are currently preferred in order to reduce the likelihood of problems with electromigration caused by the high current density carried by the bit and word lines. Copper conducting lines are usually made using a damascene process. In FIG. 1, the copper conducting line 18, in contact with the bottom of the TMR devices 10, is shown in the plane of the paper. To make conducting lines over the devices, first a thick insulating layer is deposited over the MRAM array. Trenches are etched into the insulating layer to expose the top surfaces of the TMR devices 10. Copper is deposited to fill the trenches and make electrical contact to the TMR devices 10. Top electrodes (not shown in FIG. 1) over the TMR devices 10 are preferably also formed by damascene processing.

Although trenches are usually etched anisotropically through a patterned mask, overetching can occur both in the width of the trench and in the depth of the etch. If the etch is too deep, gaps develop along the sidewalls of the memory devices. Subsequent copper deposition fills the gaps and can short the memory devices. A more robust method of forming conducting lines over magnetic memory devices is needed.

SUMMARY OF THE INVENTION

A method of forming a magnetic random access memory (MRAM) is provided. A plurality of individual magnetic memory devices with cap layers are defined on a substrate. A continuous first insulator layer is provided over the substrate and the magnetic memory devices. Portions of the first insulator layer are removed at least over the magnetic memory devices and then the cap layers are selectively removed, thus exposing active top surfaces of the magnetic memory devices. Top conductors are formed in contact with the active top surfaces of the magnetic memory devices.

In accordance with another aspect of the invention, a method for forming a magnetoresistive memory on a semiconductor substrate having an underlying integrated circuit component is provided. A plurality of protrusions comprising magnetoresistive memory layers with a capping layer as an uppermost layer is formed. A conformal layer of spacer material is deposited over the protrusions and a spacer etch is performed, thereby forming spacers along side surfaces of the protrusions. A layer of insulating material is formed over the protrusions, the spacers and the substrate. The insulating material is removed at least over the protrusions, the capping layer is selectively etched away and a metallization process is performed to make contact to the magnetoresistive memory layers.

In another aspect of the invention, a magnetic memory structure is provided. The structure comprises a plurality of magnetic memory stacks, each stack in a stud configuration. There is a first insulator layer around the magnetic memory stacks, and the top surfaces of the magnetic memory stacks are recessed below the top surface of the first insulator layer. There is a metal conductor in contact with the top surface of the magnetic memory stacks.

DETAILED DESCRIPTION OF THE PREFERRED EMBODIMENT

The aforementioned needs are satisfied by the process of the present invention. The preferred embodiments employ a sacrificial cap over the active memory device. The cap is more easily etched than the surrounding insulator material(s), resulting in good control in etching the trench for the top conductor with much less chance of an overetch. In another embodiment, spacers with a low etch rate are used around the active memory device, so that even if an overetch does occur, the spacers are relatively unaffected, and the sides of the memory device remain protected by the spacers.

These and other objects and advantages of the present invention will become more fully apparent from the following description taken in conjunction with the accompanying drawings. Reference will be made to the drawings wherein like numerals refer to like parts throughout.

Figure 1:
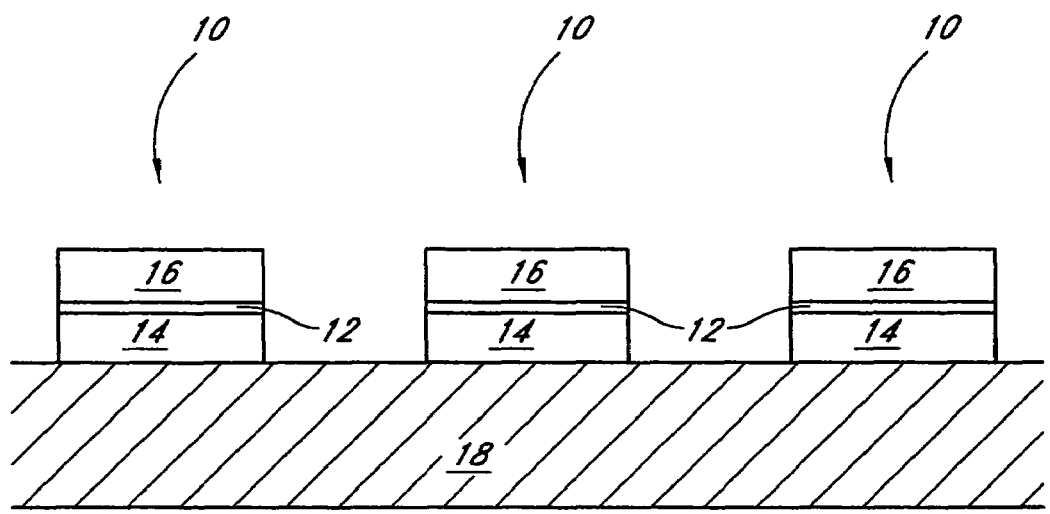
FIG. 1 is a cross section drawing of a portion of an array of TMR magnetic memory devices having stud configurations, in accordance with the prior art.
Figure 2:
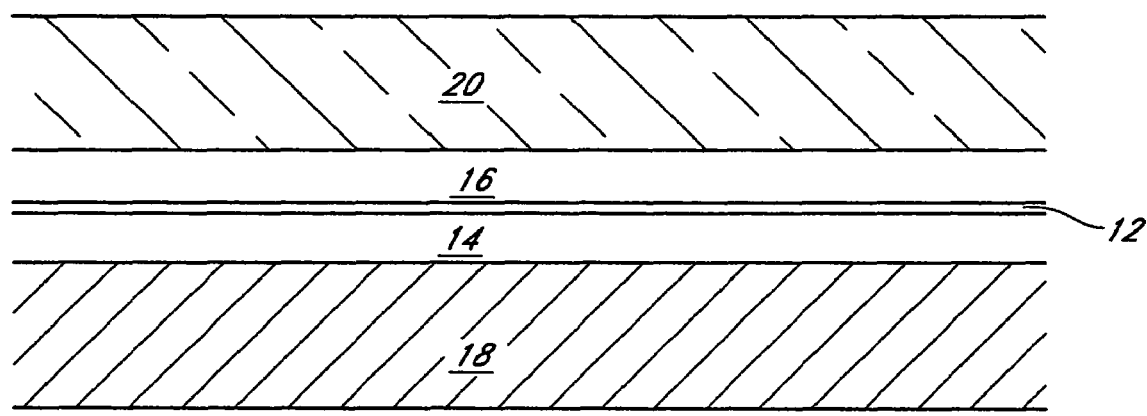
FIG. 2 is a cross-section drawing of blanket layers of a magnetic memory stack and a cap material, constructed in accordance with the preferred embodiments of the present invention.

FIG. 2 is a starting point for the illustrated embodiments of the current invention. The embodiments are illustrated for a TMR magnetic memory cell, having a top surface and an outside surface but the embodiments of the invention can be applied equally well to memory cells of other types. A metal conducting line 18, preferably copper or aluminum, has been formed on or in a substrate (not shown). The conducting line 18 extends to the right and to the left of the page. A first stack 14 of magnetic and associated adjacent blanket layers is deposited. A thin tunneling barrier layer 12 is deposited over the first stack 14, and a second stack 16 of magnetic and associated adjacent blanket layers is deposited over the tunneling layer 12, as is known in the art of TMR magnetic memory cell manufacture. A blanket cap layer 20 is deposited over the second TMR material stack 16. Preferably, the cap material 20 is selectively etchable relative to the top portion of the second TMR stack 16. More preferably, the cap material comprises a non-metal such as amorphous carbon, diamond-like carbon, amorphous silicon, silicon carbide, deposited by the BLOK™ (AMAT) process or a silicon-rich oxynitride, such as DARC (dielectric anti-reflective coating).

Figure 3:
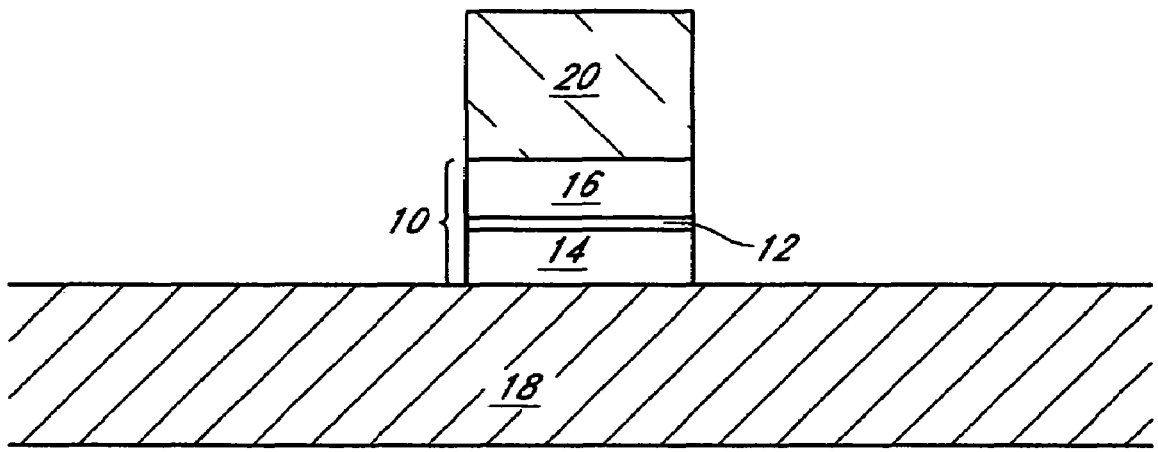
FIG. 3 is a cross-section drawing of an individual magnetic memory device with a cap layer in a stud configuration as etched from the blanket layers of FIG. 2.

FIG. 3 shows one TMR memory cell stud 10 with the capping layer 20 after the blanket layers of FIG. 2 have been patterned and etched into an array of memory cells. Patterning and etching can be done by depositing a mask layer over the cap layer, then patterning the mask layer and etching the cap layer and the magnetic memory layers through exposed regions in the mask. A silicon oxide hard mask material is one material suitable for the mask layer.

Figure 4:
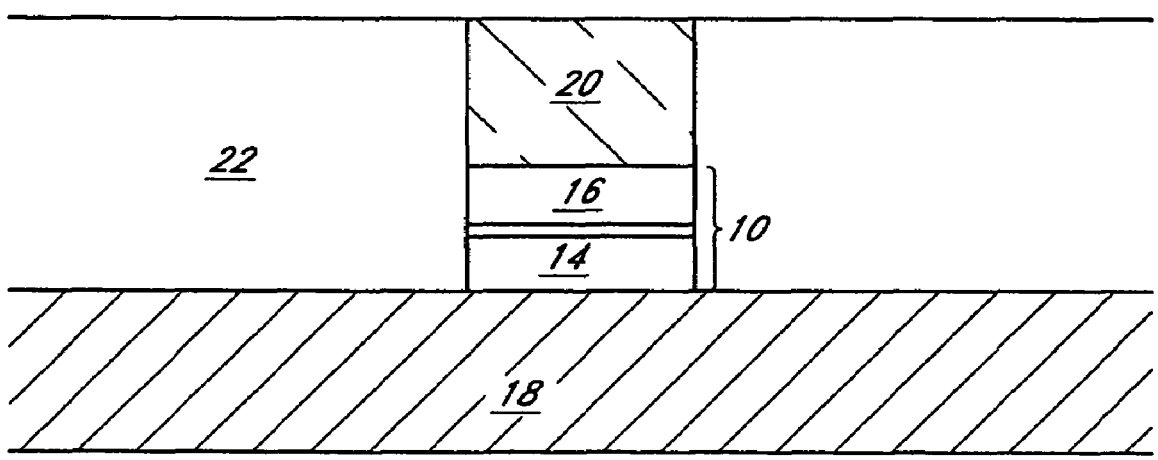
FIG. 4 is a cross-section drawing of the memory device of FIG. 3 surrounded by a first insulator layer.

In FIG. 4, a continuous first insulator or interlevel dielectric (ILD1) layer 22 has been deposited and planarized, preferably using chemical-mechanical planarization (CMP), to expose the top of the capping layer 20. Although CMP is preferred, other methods, such as etching, can be used to remove ILD1 22 from over the cap 20. In one embodiment, ILD1 22 comprises silicon oxide, formed by decomposition of TEOS (tetraethylorthosilicate). In another embodiment, ILD1 22 is silicon nitride. One of the advantages of the illustrated embodiment is apparent at this step. Generally, the top portion of the top magnetic stack 16 comprises metal, such as tantalum. It is difficult to stop the CMP process at the exact top of the memory cell 10. If the top portion of the memory cell 10, the thin metal layer, is damaged or removed, it may be difficult to make good electrical contact to the cell. If too much metal is removed, it would interfere with overall operation of the cell. Furthermore, some metals tend to smear during CMP, which results in broader application of metal than desired. The capping layer 20 can undergo CMP without the ill effects described above. The cap is not an active, functional part of the memory cell. Even if some of the cap 20 is removed during CMP, the underlying cell 10 remains intact. The materials preferred for the cap 20, as discussed above, do not have a tendency to smear during CMP. Thus the cap material remains localized over the memory cell 10.

Figure 5:
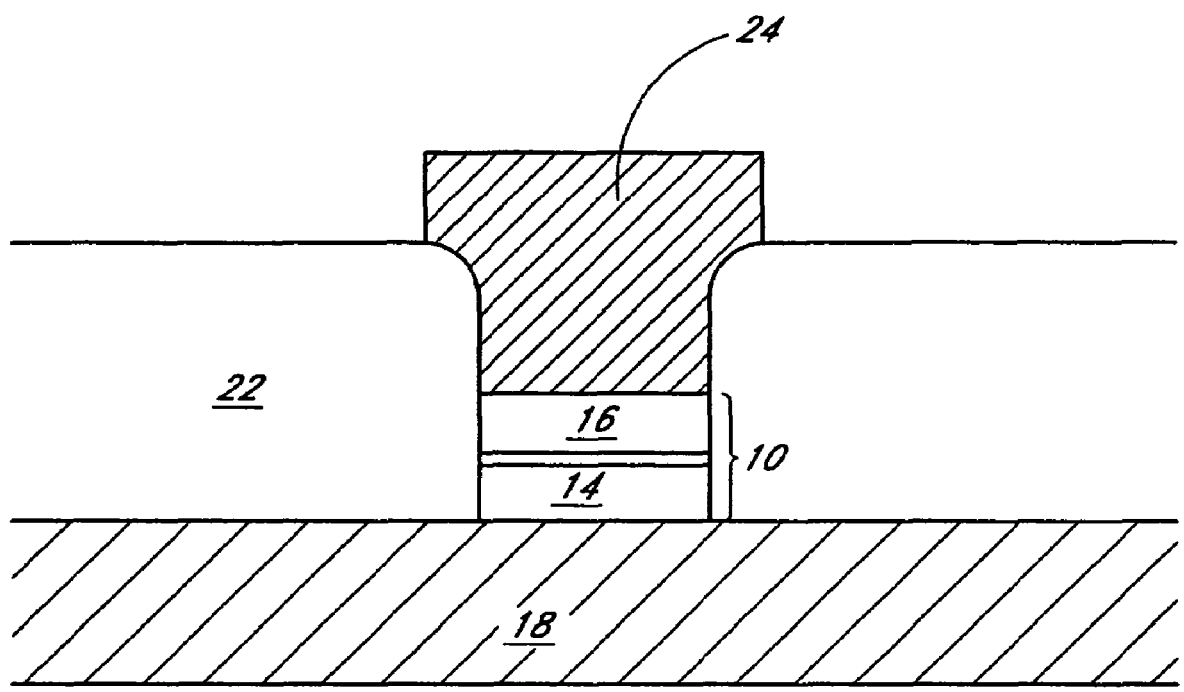
FIG. 5 is a cross-section drawing of the memory device of FIG. 4 with the cap removed and a top conductor, made by a standard metallization process, in contact with the device, in accordance with one arrangement.

An embodiment that involves a standard metallization is shown in FIG. 5. The cap 20 has been removed. Preferably the cap 20 is removed by an etch process that is preferential for the cap material over the ILD1 22. A preferential etch is performed to remove the cap 20. If the cap 20 comprises amorphous or diamond-like carbon, it is preferable to remove it using an oxygen plasma. If the cap 20 comprises amorphous silicon, it is preferable to remove it using Cl, HBr, HI or $NF_3$ plasma. If the cap 20 comprises silicon carbide or a silicon-rich oxynitride, it is preferable to remove it using a halide chemistry having no carbon, such as $Cl_2$ or $NF_3$. If the cap 20 comprises DARC (dielectric anti-reflective coating comprising a silicon-rich silicon oxynitride), it is preferable to remove it using $NF_3/Cl_2$, which has a 2:1 etch rate for DARC vs. silicon oxide from TEOS. These and other materials and chemicals aspects of the illustrated embodiments are summarized in Table I. For the purposes of the present disclosure, we define a material to be etched preferentially when the etch rate for that material is at least about 2 times greater, preferably 5 times greater and more preferably 10 times greater than for surrounding materials.

A metal layer, preferably comprising aluminum, is deposited, patterned and etched. The metal 24 fills the region formerly occupied by the cap 20. The portion of the patterned metal 24 above the top surface of the ILD1 22 comprises a top conductor line running into the page of FIG. 5, making electrical connections along a row of cells 10. A second insulating layer (not shown) can be deposited over conducting lines 24, and processing can continue.

The structure of the embodiment illustrated in FIG. 5 comprises a multi-layer magnetic memory cell 10, preferably a TMR memory cell, in contact at its bottom surface with a conducting line 18, preferably comprising aluminum or copper. The thickness of the conducting line 18 is between about 100 nm and 350 nm. The thickness of the multi-layer magnetic memory cell 10 is between about 20 nm and 50 nm. The width of the cell is between about 150 nm and 500 nm. The cell is surrounded on its sides by an insulating layer 22, preferably silicon oxide or silicon nitride. The insulating layer 22 is taller than the memory cell 10, having a thickness of between about 50 nm and 100 nm. The top surface of the memory cell 10 is recessed from the top surface of the insulating layer 22 by between about 20 nm and 50 nm. The corners of the insulating layer 22 at the top of the recess are slightly rounded from the cap etch process. Metal 24, preferably comprising aluminum, fills the recess between the memory cell 10 and the top of the insulating layer 22, making electrical connection to the memory cell 10, and forms a line extending over the top surface of the insulating layer 22 between about 10 nm and 50 nm on either side of the recess and connecting a row of memory cells 10. The cross section of the metal line 24 over the memory cell 10 has a T-shape. The top portion of the T-shape 24 is wider than the memory cell 10. Advantageously, the extra width in the metal line 24 creates a magnetic field that is more effective in writing to the bit 10 than the field from a thinner metal line, but the selectively etchable cap reduces the rish of shorting despite the electrode width.

Figure 6A:
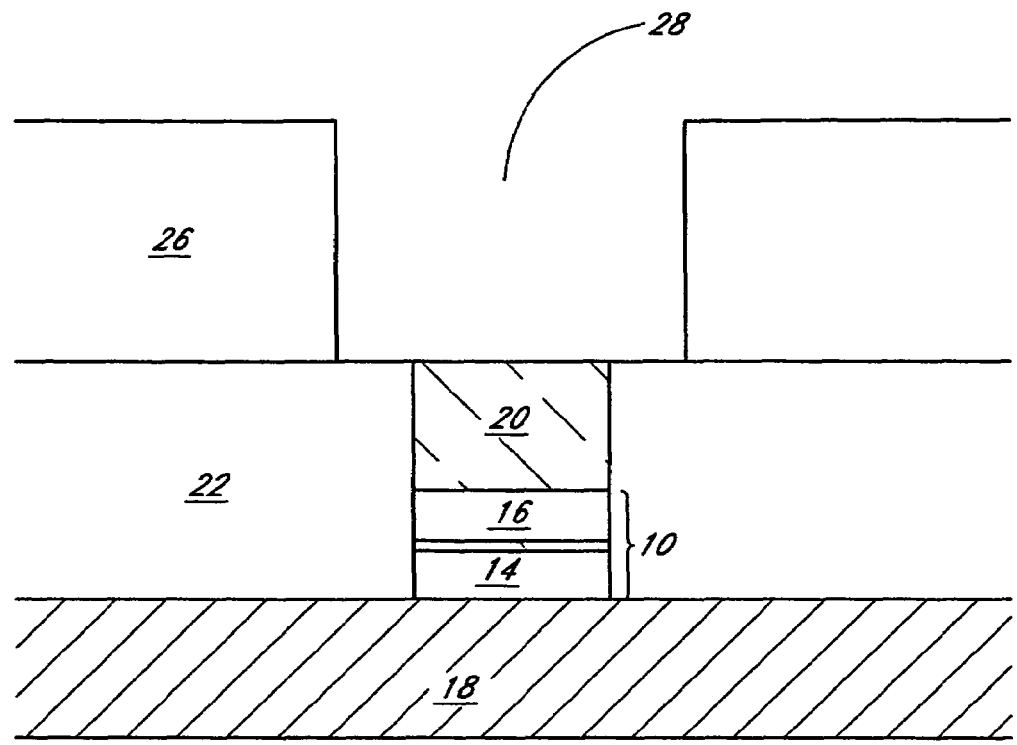
FIG. 6A is a cross-section drawing of the memory device of FIG. 4 after a second insulator layer has been deposited and a trench has been etched into the second insulator layer, in accordance with another arrangement.

Another embodiment of the current invention involves metallization using a dual damascene process, which is described with reference to FIGS. 6A and 6B. ILD1 22 is deposited and planarized as described above for FIG. 4. In FIG. 6A, the cap 20 is still in place. A second blanket insulating layer, ILD2 26, is deposited over ILD1 22. A trench 28 is etched into ILD2 26, down to the top surface of the cap 20 and to the top surface of ILD1 22, and along a row of memory cells 10 into the page. Preferably, the trench 28 is wider than the cap 20, as shown in FIG. 6A.

Figure 6B:
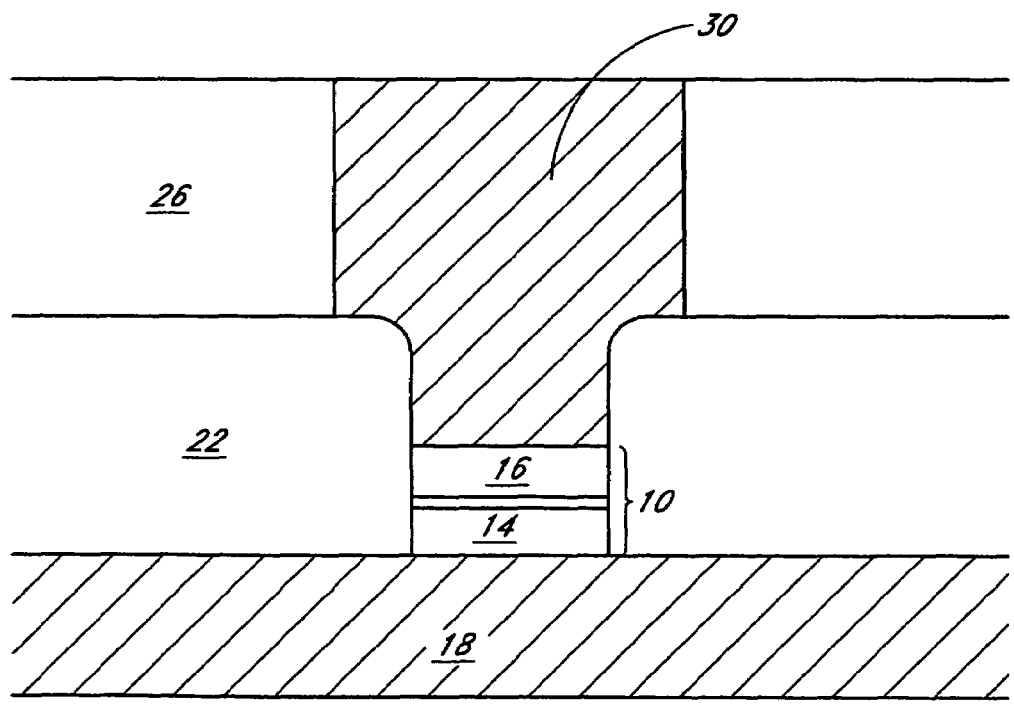
FIG. 6B is a cross-section drawing of the memory device of FIG. 6A after the cap has been removed and a top conductor, in contact with the device, has been made by a dual damascene process.

As shown in FIG. 6B, a layer of metal, preferably copper, has been deposited to fill the opening over the memory cell 10 left by the cap 20 removal and to fill the trench 28 connecting a row of memory cells 10. Alternatively, the trench 28 may be lined with barrier and/or seed layers before being filled with metal. The top surface of ILD2 26 is planarized to remove excess metal and to leave a flat surface for further processing steps. The resulting top conducting line 30 has a T-shaped cross section over the memory cells 10, which, as discussed above, results in a more effective magnetic field at the bit.

The structure illustrated in FIG. 6B comprises a multi-layer magnetic memory cell 10, preferably a TMR memory cell, in contact at its bottom surface with a conducting line 18, preferably comprising copper or aluminum. The thickness of the conducting line 18 is between about 100 nm and 350 nm. The thickness of the multi-layer magnetic memory cell 10 is between about 20 nm and 50 nm. The width of the cell is between about 150 nm and 500 nm. The cell is surrounded on its sides by an insulating layer 22, preferably silicon oxide or silicon nitride. The insulating layer 22 is taller than the memory cell 10, having a thickness of between about 50 nm and 100 nm. The top surface of the memory cell 10 is recessed from the top surface of the insulation by between about 20 nm and 50 nm. The corners of the insulating layer 22 at the top of the recess are slightly rounded. A second insulating layer 26, preferably comprising silicon oxide or silicon nitride, and having a thickness between about 100 nm and 300 nm overlies the first insulating layer 22. There is a trench in the second insulating layer directly over, and preferably having a width greater than, the magnetic memory cell 10. The width of the trench is between about 50 nm and 1500 nm. The trench in the second insulating layer 26 and the recess between the magnetic memory cell 10 and the top of the first insulating layer 22 are filled continuously by a conducting material 30, preferably copper. Alternatively, the trench 28 may be lined with barrier and/or seed layers before being filled with metal. The cross section of the conducting line 30 has a T-shape in the region over the magnetic memory cell 10. The top surface of the conducting line 30 is coplanar with the top surface of the second insulating layer 26.

Figure 7A:
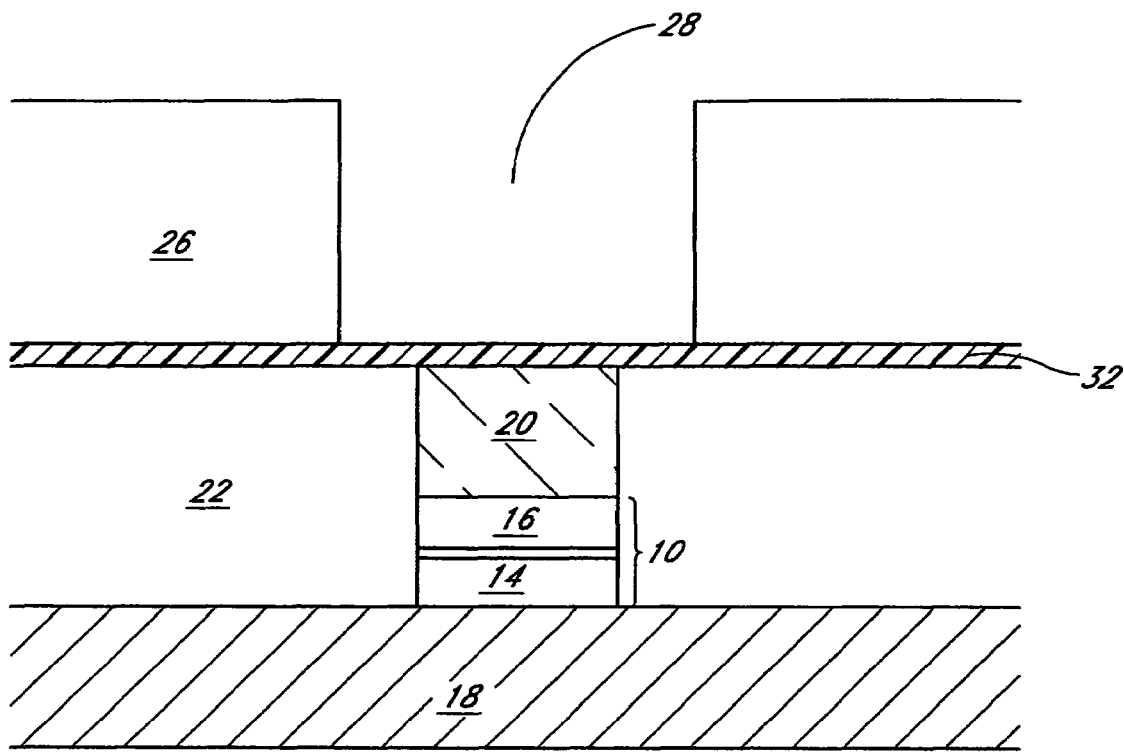
FIG. 7A is a cross-section drawing of an alternative embodiment for a dual damascene process wherein an etch stop layer has been deposited between the first insulator layer and the second insulator layer.
Figure 7B:
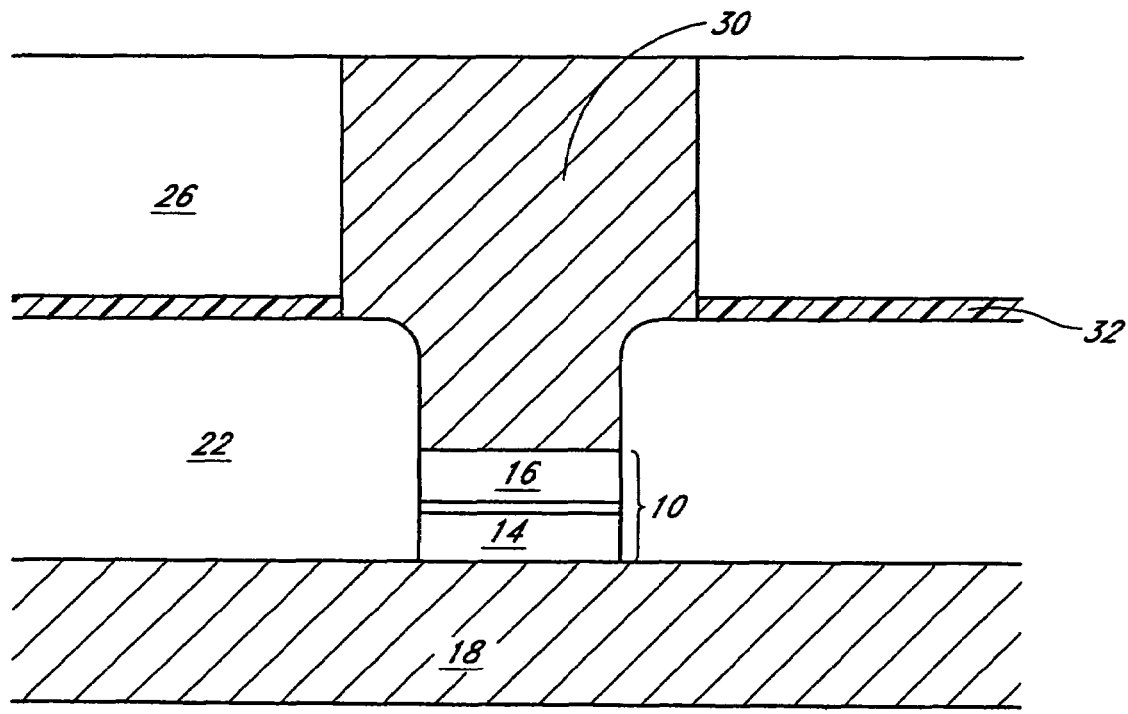
FIG. 7B is a cross-section drawing of the alternative embodiment of FIG. 7A after the etch stop layer has been removed from the bottom of the trench in the second insulator layer, the cap has been removed, and the top conductor has been formed.

In an alternative dual damascene process, as shown in FIG. 7A, an etch stop layer 32 is formed on the top surface of ILD1 22 and the cap 20 before deposition of ILD2 26. Preferably, the etch stop layer 32 comprises a material that can be etched more slowly than ILD2 26, such as silicon carbide or some silicon nitrides. Of course, the etch rate depends both on the material and the etchant. The etch stop layer 32 can, in some arrangements, comprise the same material as the cap 20. After deposition of ILD2 26, a trench 28 is etched into ILD2 26 down to the etch stop layer 32 along a row of memory cells 10. As shown in FIG. 7B, an additional etch has been performed to remove preferentially the etch stop layer 32. Another etch is performed to remove preferentially the cap 20. Of course, if the etch stop layer 32 and the cap 20 comprise the same material, they may both be removed in the same etch step. Finally a layer of metal 30, preferably copper, is deposited to fill the opening over the memory cell 10 left by the cap 20 removal and to fill the trench 28 connecting a row of memory cells 10. Alternatively, the opening left by the cap 20 removal and the trench 28 may be lined with barrier and/or seed layers before being filled with metal. The top surface of ILD2 26 is planarized to remove excess metal and to leave a flat surface for further processing steps.

The embodiment illustrated in FIG. 7B is the same as the embodiment of FIG. 6B with one modification. An etch stop layer 32, preferably silicon carbide or silicon nitride, having a thickness between about 10 nm and 300 nm, lies between the bottom surface of the second insulating layer 26 and the top surface of the first insulating layer 22. The etch stop layer 32 does not extend into the trench region that has been cut into the second insulating layer 26, but is confined to the region under the second insulating layer 26 only.

Figure 8:
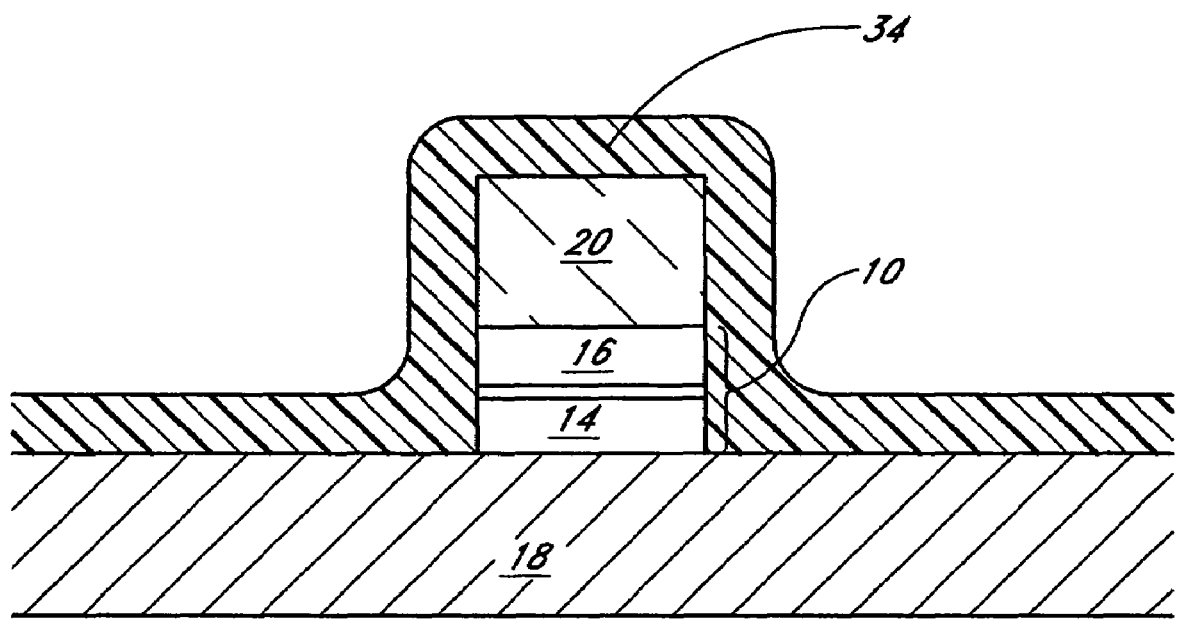
FIG. 8 is a cross-section drawing of the memory device of FIG. 3, over which a layer of spacer material has been deposited, in accordance with another embodiment.

In another embodiment of the invention, a spacer is provided around the magnetic memory cell. This process and structure can be understood with reference to FIGS. 8–13. FIG. 8 shows the memory cell 10 with cap 20 of FIG. 3 after a layer of spacer material 34 has been deposited conformally over an array of memory cells. Preferably, the spacer material 34 etches more slowly than both the cap material and ILD1. Of course, the etch rate depends on both the material and the etchant. More preferably, the spacer material also etches faster than the ILD1 22 (FIG. 10) to be deposited. For example, the spacer material can comprise silicon carbide or silicon nitride.

Figure 9:
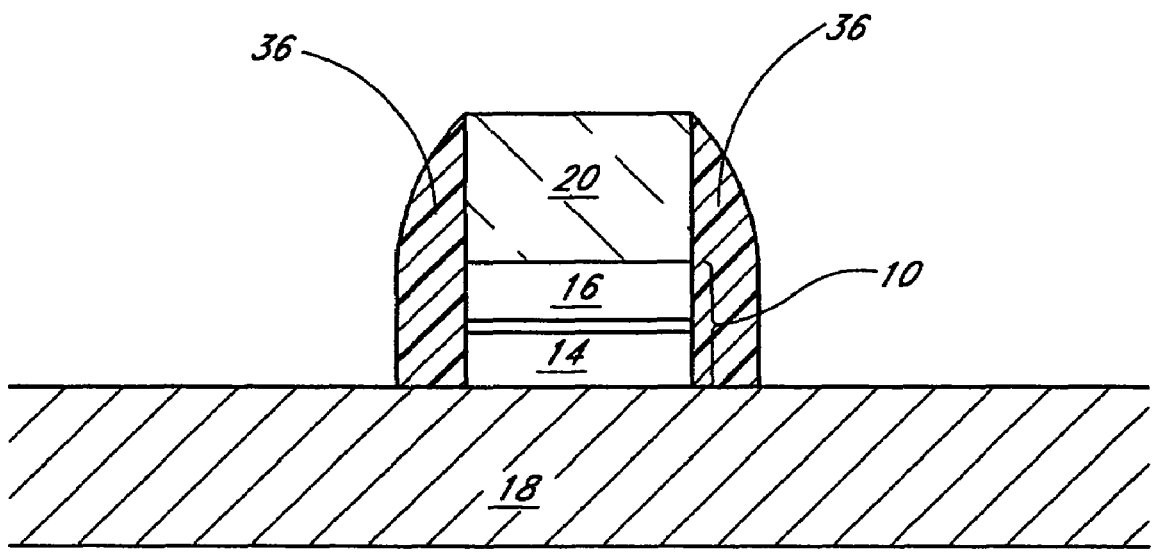
FIG. 9 is a cross-section drawing of the memory device of FIG. 8 after a spacer etch.

FIG. 9 shows the memory cell 10 with cap 20 after an anisotropic spacer etch has been performed. Horizontal portions of spacer material layer 34 have been removed. Vertical portions of layer 34 remain to form a spacer 36 around the memory cell 10 and cap 20. FIG. 9 is a cross section drawing from approximately the center of the memory cell 10 and shows the spacer 36 only along two sides of the memory cell 10 and cap 20. Actually, the spacer 36 forms a continuous covering all the way around the sides of the memory cell 10 and cap 20.

Figure 10:
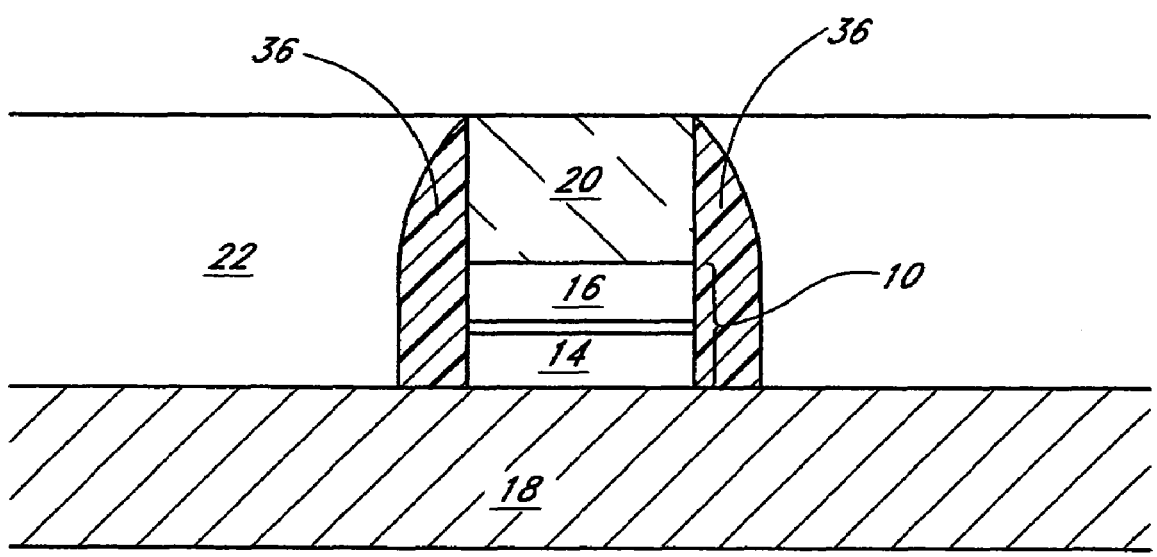
FIG. 10 is a cross-section drawing of the memory device of FIG. 9 surrounded by the first insulator layer.

In FIG. 10, a first insulator layer or ILD1 22 has been deposited and planarized, much as was described for FIG. 4 above. Preferably the ILD1 22 etches slower than the spacer 36. Preferably the ILD1 22 comprises a soft, reflowable oxide, such as an oxide deposited from TEOS (tetraethylorthosilicate). There is no danger of smearing a metal surface of the top portion 16 of the memory cell 10 or of damaging the memory cell 10 during CMP of ILD1 22 to expose the cap 20, and the memory cell 10 is protected by the cap 20.

Figure 11:
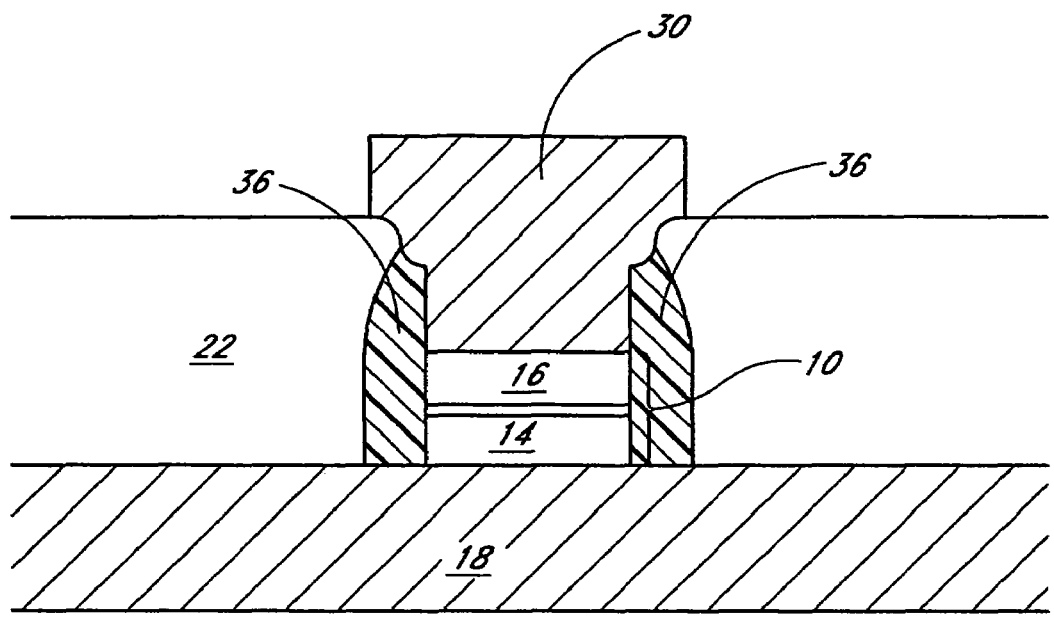
FIG. 11 is a cross-section drawing of the memory device of FIG. 10 with the cap removed and a top conductor, made by a standard metallization process, in contact with the device.

FIG. 11 shows the memory cell 10 with spacer 36 after a standard metallization process. The cap 20 has been removed by a preferential etch. The cap 20 is removed completely by the etch process, and small amounts of the top surfaces of the spacer 36 and ILD1 22 near the cap 20 have also been removed by the etch. Even thought the etch is preferential for removing the cap 20, it has some effectiveness in etching the surrounding materials, such as the spacer 36 and ILD1 22. Preferably the spacer 36 etches faster than the ILD1 22. A metal layer, preferably aluminum, has been deposited to fill the recess left after the etch process. The metal layer has been patterned and etched to leave metal lines 30 perpendicular to the plane of the page, in electrical contact with the memory cell 10 and acting as a top conductor above ILD1 22, connecting a row of memory cells 10. Again, the electrode 30 is wider than the memory cell 10, which is better for flipping the bit 10. Selective processing facilitates a wider electrode without shorting out the memory cell from mask misalignment. A second insulating layer (not shown) can be deposited over the metal lines 30.

The structure of the embodiment illustrated in FIG. 11 comprises a multi-layer magnetic memory cell 10, preferably a TMR memory cell, in contact at its bottom surface with a conducting line 18, preferably comprising aluminum or copper. The thickness of the conducting line 18 is between about 100 nm and 350 nm. The thickness of the multi-layer magnetic memory cell 10 is between about 20 nm and 50 nm. The width of the cell is between about 150 nm and 500 nm. The cell is surrounded on its sides by an insulating layer 22, preferably silicon oxide or silicon nitride. The insulating layer 22 is taller than the memory cell 10, having a thickness of between about 50 nm and 100 nm. The top surface of the memory cell 10 is recessed from the top surface of the insulation by between about 20 nm and 50 nm. The corners of the insulating layer 22 at the top of the recess are slightly rounded. Between the memory cell 10 and the surrounding insulating layer 22, there is a spacer 36, preferably comprising silicon carbide or silicon nitride. The spacer 36 has a height that is between the height of the memory cell 10 and the height of the insulating layer 22. The spacer 36 is thickest at the bottom, adjacent to the conducting line 18, and becomes more narrow as it reaches its full height. At the thickest part, the spacer 36 has a thickness between about 10 nm and 40 nm. A metal line 24, preferably comprising aluminum, fills the recess between the memory cell 10 and the top of the insulating layer 22, making electrical connection to the memory cell 10 and contacting the inside and top surfaces of the spacer 36 along the edges of the recess. Alternatively, the recess may be lined with barrier and seed layers before being filled with metal. The metal extends over the top surface of the insulating layer 22 between about 10 nm and 50 nm on either side of the recess, thus providing a magnetic field that is better for flipping the bit 10.

Figure 12:
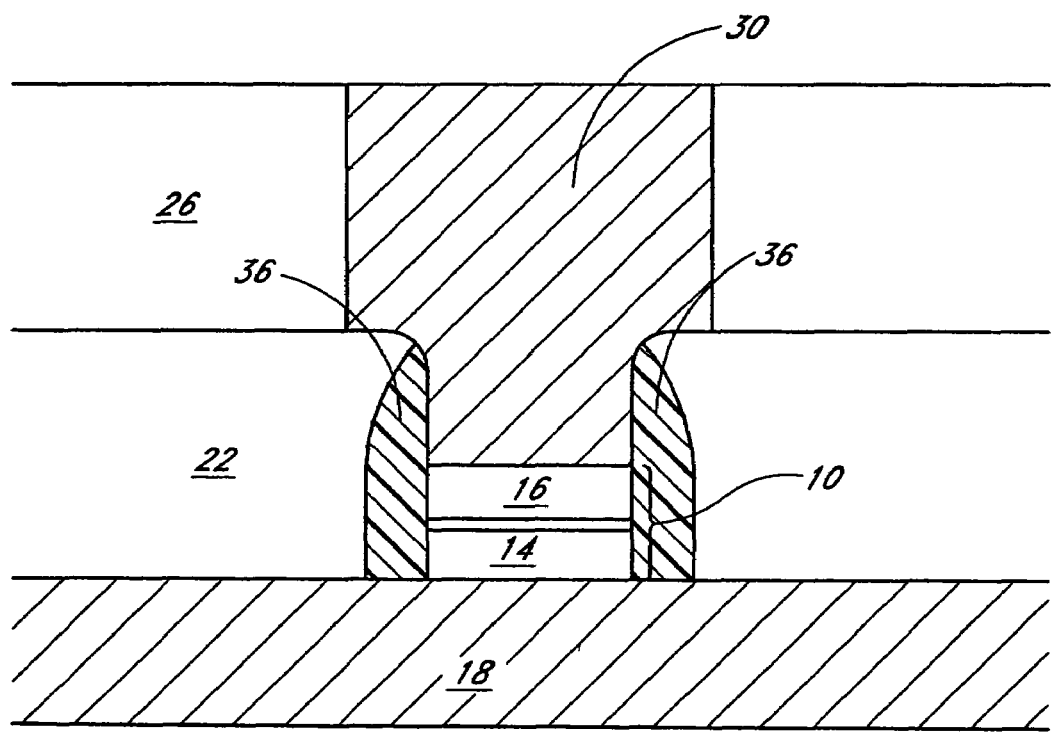
FIG. 12 is a cross-section drawing of the memory device of FIG. 10 with the cap removed and a top conductor, made by a dual damascene process, in contact with the device according to a preferred embodiment.

Metallization by a dual damascene process is shown in FIG. 12. After spacer 36 formation, ILD1 22 deposition and planarization as shown in FIG. 10, a second insulating layer, ILD2 26 is formed. A trench is etched into ILD2 26 down to the surface of ILD1 22 and the cap 20. The cap 20 is removed by a preferential etch, which also removes some small portion of the top surface of the spacer 36 and ILD1 22 near the cap 20. The etch rate is preferably fastest for the cap 20, slower for the spacer 36 and slowest for ILD1 22.

The structure of the embodiment illustrated in FIG. 12 comprises a multi-layer magnetic memory cell 10, preferably a TMR memory cell, in contact at its bottom surface with a conducting line 18, preferably comprising copper or aluminum. The thickness of the conducting line 18 is between about 100 nm and 350 nm. The thickness of the multi-layer magnetic memory cell 10 is between about 20 nm and 50 nm. The width of the cell 10 is between about 150 nm and 500 nm. The cell 10 is surrounded on its sides by an insulating layer 22, preferably silicon oxide or silicon nitride. The insulating layer 22 is taller than the memory cell 10, having a thickness of between about 500 nm and 1000 nm. The top surface of the memory cell 10 is recessed from the top surface of the insulation by between about 20 nm and 50 nm. The corners of the insulating layer 22 at the top of the recess are slightly rounded. Between the memory cell 10 and the surrounding insulating layer 22, there is a spacer 36, preferably comprising silicon carbide or silicon nitride. The spacer 36 has a height that is between the height of the memory cell 10 and the height of the insulating layer 22. The spacer 36 is thickest at the bottom, adjacent to the conducting line 18, and becomes more narrow as it reaches its full height. At the thickest part, the spacer 36 has a thickness between about 10 nm and 40 nm. A second insulating layer 26, preferably comprising silicon oxide or silicon nitride, and having a thickness between about 100 nm and 300 nm overlies the first insulating layer 22. There is a trench in the second insulating layer directly over the memory cell 10, preferably having a width greater than the combined width of the magnetic memory cell 10 and the spacer 36. The width of the trench is between about 300 nm and 1000 nm. The trench in the second insulating layer 26 and the recess between the magnetic memory cell 10 and the top of the first insulating layer 22 are filled continuously by a conducting material 30, preferably copper. Alternatively, the trench and the recess may be lined with barrier and seed layers before being filled with metal.

In another arrangement (not shown), an etch stop layer can be formed over ILD1 22 before deposition of ILD2 26 in the structure of FIG. 12 as was shown for the non-spacer embodiment in FIGS. 7A–7B.

Figure 13:
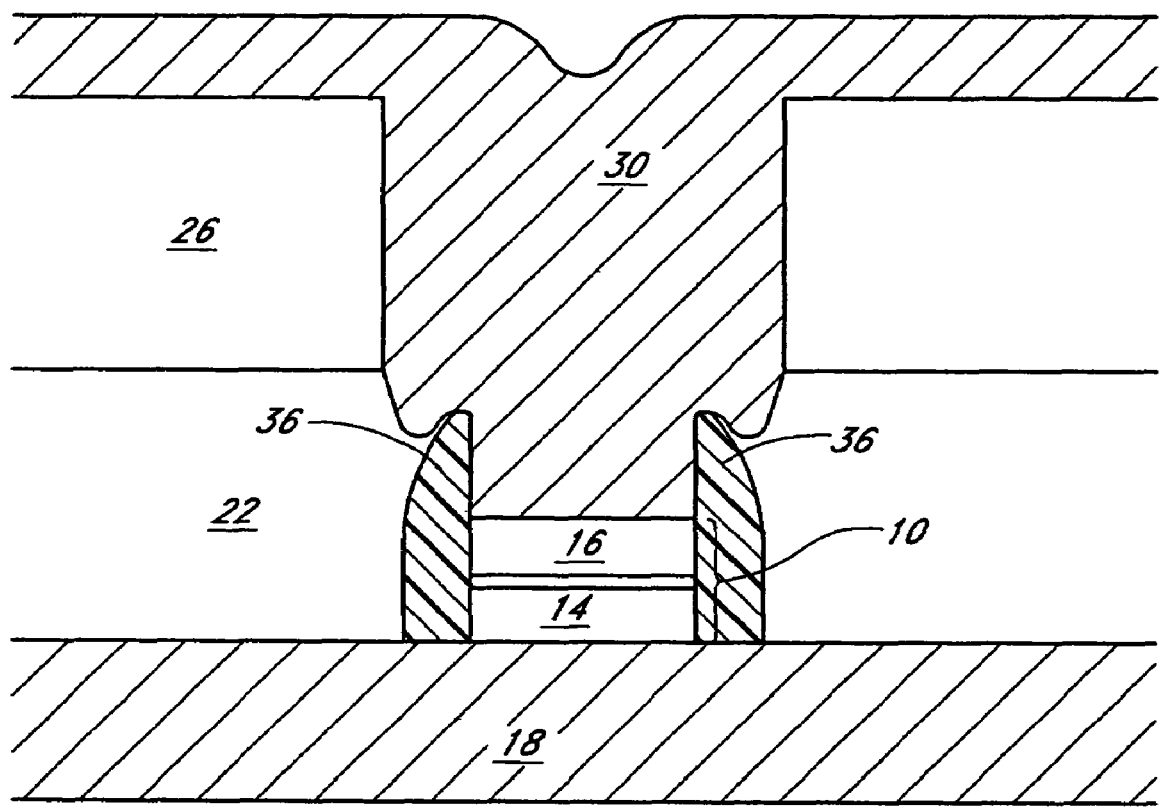
FIG. 13 is a cross-section drawing of the memory device of FIG. 10 with the cap removed and a top conductor, made by a dual damascene process, in contact with the device according to an alternative embodiment wherein the second insulator layer has been overetched, and metal extends part way into the first insulator layer.

Another embodiment of the current invention is shown in FIG. 13, wherein the materials used in the structure and/or the etchants used are different than for FIG. 12 and therefore result in a different structure. The etchant used to form a trench in ILD2 26 also etches ILD1 22 faster than it etches the spacer 36. The etch rate is fastest for the cap layer 20, slower for ILD1 22 and slowest for the spacer 36. The etched region extends into ILD1 22 along the outside surfaces of the spacer 36 due to the width of the overlying trench. The spacer 36 material is more resistant to the etchant than is ILD1 22. When the metal layer is deposited, it fills the overetched regions in addition to the recess left after the cap is removed and the trench etched into ILD2 26. Of course, the trench, the recess and the overetched regions may all be lined with barrier and/or seed layers before the metal is deposited. Even with the illustrated overetch, the memory device 10 is neither damaged nor shorted out, as it is insulated and protected by the spacer 36 that surrounds it.

Table I summarizes various possible combinations of materials and chemistries in accordance with the illustrated embodiments.

TABLE I

| Embodiment | 1a | 1b | 2a | 2b | 3 | 4 |
|---|---|---|---|---|---|---|
| cap 20 | amorphous C diamond-like C | | amorphous Si | | SiC (BLOK ™ - AMAT) | DARC (Si-rich oxynitride) |
| ILD1 22 | TEOS | Si—N | TEOS | Si—N | TEOS | TEOS |
| ILD2 26 | TEOS | Si—N | TEOS | Si—N | TEOS | TEOS |
| etch stop 32 optional | SiC or Si—N | SiC | SiC or Si—N | SiC | SiC of Si—N | SiC or Si—N |
| spacer 36 | SiC or Si—N | SiC | SiC* Si—N | SiC | Si—N | — |
| etchant to selectively remove cap 20 | oxygen plasma | | Cl, HBr, HI, NF$_3$ (halide) plasmas | | Cl$_2$/NF$_3$ no carbon | NF$_3$/Cl$_2$ |

For embodiment 1a, the cap 20 comprises amorphous carbon or diamond-like carbon. ILD1 22 and ILD2 26 comprise silicon oxide formed from TEOS. The cap 20 can be etched selectively using an oxygen plasma. For embodiment 1b, the cap 20 comprises amorphous carbon or diamond-like carbon. ILD1 22 and ILD2 26 comprise silicon nitride. The cap 20 can be etched selectively using an oxygen plasma. For embodiment 2a, the cap 20 comprises amorphous silicon. ILD1 22 and ILD2 26 comprise silicon oxide formed from TEOS. The cap 20 can be etched selectively using a halide plasma. For embodiment 2b, the cap 20 comprises amorphous silicon. ILD1 22 and ILD2 26 comprise silicon nitride. The cap 20 can be etched selectively using a halide plasma. For embodiment 3, the cap 20 comprises silicon carbide. ILD1 22 and ILD2 26 comprise silicon oxide formed from TEOS. The cap 20 can be etched selectively using Cl$_2$ or NF$_3$. For embodiment 4, the cap 20 comprises DARC. ILD1 22 and ILD2 26 comprise silicon oxide formed from TEOS. The cap 20 can be etched selectively using at least one of NF$_3$ and Cl$_2$. Optional etch stop 32 materials and spacer 36 materials are also listed in Table I for each embodiment.

It should be understood that preferential etching depends on both the materials and the etchants. Thus, materials and etchants must be carefully chosen to produce the desired relative etching removal rates. The etchants for each embodiment in Table I have been chosen because they preferentially remove the associated cap 20 material relative to the associated insulating layers ILD1 22 and ILD2 26. For the purposes of the present disclosure, we define a material to be etched preferentially when the etch rate for that material is at least about 2 times greater, preferably 5 times greater and more preferably 10 times greater than for surrounding materials.

Although the foregoing description of the preferred embodiments of the present invention has shown, described and pointed out the fundamental novel features of the invention, it will be understood that various omissions, substitutions and changes in the form of the detail of the structures as illustrated as well as the uses thereof may be made by those skilled in the art, without departing from the spirit of the present invention. Consequently, the scope of the present invention should not be limited to the foregoing discussion, but should be defined by the appended claims.

We claim:

1. A magnetic memory structure, comprising:
    a plurality of magnetic memory stacks for an MRAM, each stack having at least a first magnetic layer, a barrier layer, and a second magnetic layer, each stack in a stud configuration and having a top surface;
    spacers having vertical inner walls and having outer walls that taper convexly towards an upper surface, the spacers disposed around the magnetic memory stacks such that lower portions of spacers surround the first magnetic layers, the barrier layers, and the second magnetic layers of the stacks, the spacers comprising a first dielectric material, portions of the spacers extending above the top surface of the magnetic memory stacks, the spacers defined such that horizontal portions of spacer material between adjacent magnetic memory stacks are absent;
    a first insulator layer around the spacers, the first insulator layer comprising a second dielectric material different from the first dielectric material, the top surfaces of the magnetic memory stacks having a height recessed below a height of a top surface of the first insulator layer; and
    a metal conductor in contact with the top surface of the magnetic memory stacks.

2. The magnetic memory structure of claim 1 wherein a top layer of the magnetic memory stacks comprises tantalum.

3. The magnetic memory structure of claim 1 wherein the first insulator layer comprises TEOS (tetraethylorthosilicate), and the spacer comprises silicon nitride or silicon carbide.

4. The magnetic memory structure of claim 1 wherein the first insulator layer comprises silicon nitride, and the spacer comprises silicon carbide.

5. The magnetic memory structure of claim 1 wherein the metal conductor comprises copper.

6. The magnetic memory structure of claim 1, further comprising a second insulator layer over the first insulator layer.

7. The magnetic memory structure of claim 6, further comprising an etch stop layer between the first insulator layer and the second insulator layer.

8. The magnetic memory structure of claim 6, further comprising trenches filled with metal conductor material in the second insulator layer, the trenches directly over the magnetic memory stacks.

9. The magnetic memory structure of claim 8 wherein the trenches filled with metal conductor material in the second insulator layer are wider than the magnetic memory stacks.

10. A metallization for a tunneling magnetoresistance (TMR) MRAM, comprising:
    a plurality of TMR memory cells for the MRAM;
    lines of copper having T-shaped cross sections in regions over the memory cells, wherein at least portions of a bottommost surface of each line are in contact with top surfaces of corresponding memory cells;
    insulating spacers around the memory cells wherein the spacers are taller than the memory cells and are in contact with at least a portion of the side surfaces of the copper lines, wherein inner walls of the insulating spacers are vertical so that side surfaces of the copper lines in contact with inner walls are vertical, wherein upper portions of outer walls of the insulating spacers are convex in vertical cross-section such that the spacer is wider at a bottom than at a top; and
    insulating material in contact with the insulating spacers at least along outer surfaces of the insulating spacers.

11. The metallization of claim 10 wherein the insulating material comprises silicon oxide, and the spacers comprise a material selected from the group consisting of silicon carbide and silicon nitride.

12. The magnetic memory structure of claim 1 wherein the spacer is thickest at the bottom, and wherein the spacer is between about 10 nm and 40 nm in thickness at the bottom.

13. The metallization of claim 10 wherein the insulating material comprises silicon nitride, and a material for the spacer comprises silicon carbide.

14. The metallization of claim 10, wherein the spacer is thickest at the bottom, and wherein the spacer is between about 10 nm and 40 nm in thickness at the bottom.

15. The metallization of claim 10, wherein the insulating spacers are of a first material and the insulating material are of a second material, wherein the first material and the second material differ at least with respect to etching removal rates.

16. An element of a magnetic random access memory array, comprising:
    a magnetic memory cell for an MRAM, the magnetic memory cell configured as a protrusion from a substrate and having a top surface and an outside surface, the magnetic memory cell having at least a first magnetic layer, a barrier layer, and a second magnetic layer;
    a dielectric spacer having vertical inside surfaces, the dielectric spacer disposed around the magnetic memory cell having a portion in contact with the outside surfaces of the first magnetic layer, the barrier layer, and the second magnetic layer of the magnetic memory cell and having a portion extending above the top surface of the magnetic memory cell, wherein outer surfaces of the spacer are convexly rounded in vertical cross-section such that a width of the spacer tapers off towards a top end of the spacer, wherein the portion of the dielectric spacer in contact with the outside surfaces does not extend to an adjacent magnetic memory cell in a horizontal direction; and
    an electrode in contact with the top surface of the magnetic memory cell and having a portion disposed between vertical inside surfaces of the spacer.

17. The element of claim 16 wherein the magnetic memory cell comprises a TMR structure.

18. The element of claim 16 wherein the spacer comprises a material selected from the group consisting of silicon carbide and silicon nitride.

19. The element of claim 16 wherein the electrode comprises a material selected from the group consisting of copper and aluminum.

20. The element of claim 16 wherein the spacer is thickest at the bottom, and wherein the spacer is between about 10 nm and 40 nm in thickness at the bottom.

21. The magnetic memory structure of claim 1, wherein outer walls of the spacers are rounded such that a thickness of the spacers tapers off towards upper ends of the spacers.

22. The metallization of claim 10 wherein the portions of the spacers in contact with the copper lines circumferentially surround the corresponding portions of the copper lines.

23. The element of claim 16, wherein the portion of the electrode disposed between inside vertical surfaces of the spacer is surrounded along the portion's circumference by the spacer.

* * * * *